(12) United States Patent
Doris et al.

(10) Patent No.: US 8,471,343 B2
(45) Date of Patent: Jun. 25, 2013

(54) PARASITIC CAPACITANCE REDUCTION IN MOSFET BY AIRGAP ILD

(75) Inventors: Bruce B. Doris, Brewster, NY (US); Kangguo Cheng, Guilderland, NY (US); Charles W. Koburger, III, Delmar, NY (US)

(73) Assignee: International Bussiness Machines Corporation, Armonk, NY (US)

( * ) Notice: Subject to any disclaimer, the term of this patent is extended or adjusted under 35 U.S.C. 154(b) by 120 days.

(21) Appl. No.: 13/216,708

(22) Filed: Aug. 24, 2011

(65) Prior Publication Data
US 2013/0049132 A1 Feb. 28, 2013

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC .................................. 257/383; 257/E21.546

(58) Field of Classification Search
USPC .......................................... 257/383, E21.546
See application file for complete search history.

(56) References Cited

U.S. PATENT DOCUMENTS

| | | | |
|---|---|---|---|
| 5,498,897 A | 3/1996 | Komatsuzaki et al. | |
| 5,792,706 A | 8/1998 | Michael et al. | |
| 5,814,555 A | 9/1998 | Bandyopadhyay et al. | |
| 6,057,226 A | 5/2000 | Wong | |
| 6,064,118 A | 5/2000 | Sasaki | |
| 6,077,767 A | 6/2000 | Hwang | |
| 6,143,646 A | 11/2000 | Wetzel | |
| 6,208,015 B1 | 3/2001 | Bandyopadhyay et al. | |
| 6,268,637 B1 | 7/2001 | Gardner et al. | |
| 6,350,679 B1 | 2/2002 | McDaniel et al. | |
| 6,710,449 B2 | 3/2004 | Hyoto et al. | |
| 6,740,592 B1 | 5/2004 | Doong | |
| 6,861,332 B2 | 3/2005 | Park et al. | |
| 6,947,651 B2 | 9/2005 | Mule' et al. | |
| 6,966,327 B2 | 11/2005 | Nguyen et al. | |
| 6,995,430 B2 | 2/2006 | Langdo et al. | |
| 7,094,669 B2 | 8/2006 | Bu et al. | |
| 7,157,365 B2 | 1/2007 | Ryan | |
| 7,875,919 B2 | 1/2011 | Booth, Jr. et al. | |
| 7,939,420 B2 * | 5/2011 | Disney et al. | 438/430 |
| 2002/0186950 A1 | 12/2002 | Mule' et al. | |
| 2004/0099951 A1 | 5/2004 | Park et al. | |
| 2004/0127001 A1 | 7/2004 | Colburn et al. | |
| 2004/0232552 A1 | 11/2004 | Wang et al. | |

(Continued)

OTHER PUBLICATIONS

Mann, R.W., et al., "Silicides and local interconnections for high-performance VLSI applications," IBM J. Res. Develop., vol. 39, No. 4, pp. 403-417, 1995.

(Continued)

*Primary Examiner* — David S Blum
(74) *Attorney, Agent, or Firm* — Novak Druce Connolly Bov + Quigg LLP; Louis J. Percello, Esq.

(57) ABSTRACT

The instant disclosure relates to MOSFET semiconductor structures exhibiting a reduced parasitic capacitance, as well as methods of making the MOSFET semiconductor structures. The MOSFET semiconductor structures of the instant disclosure comprise an air-gap interlayer dielectric material between the contacts to the source/drain and gate structures and gate stack structures. The air-gap interlayer dielectric material causes the MOSFET semiconductor structures of the instant disclosure to have a reduced parasitic capacitance.

24 Claims, 13 Drawing Sheets

➢ Selectively remove the nitride liner and nitride spacer
➢ Remove the oxide spacer (optional)

U.S. PATENT DOCUMENTS

2005/0106852 A1  5/2005  Park et al.
2005/0248033 A1  11/2005  Ryan
2007/0013392 A1  1/2007  Kim et al.
2007/0102766 A1  5/2007  Furukawa et al.
2008/0265343 A1  10/2008  Greene et al.
2010/0182078 A1  7/2010  Cantoni
2010/0210098 A1  8/2010  Faltermeier et al.
2011/0068369 A1  3/2011  Cheng et al.

OTHER PUBLICATIONS

Healey, J., "Current Technical Trends: Dual Damascene & Low-k Dielectrics," Threshold Systems, pp. 1-6, 2002.

* cited by examiner

Standard process for MOSFET up to silicide formation

➢ Remove the sacrificial ILD material, stopping on the nitride liner

PARASITIC CAPACITANCE REDUCTION IN MOSFET BY AIRGAP ILD

TECHNICAL FIELD

The present disclosure generally relates to semiconductor MOSFETs (metal-oxide-semiconductor field-effect transistors), and methods for making the MOSFETs. More specifically, the present disclosure relates to methods of forming MOSFETs with reduced contact to source-drain and gate parasitic capacitance.

BACKGROUND OF THE DISCLOSURE

Integrated circuits include several conductors distributed across the topography of their substrates. The conductors are isolated from each other, and from underlying conductive elements, with a dielectric material. Interconnect lines serve to electrically connect two or more components (e.g. conductors) within a system.

Conductor-to-conductor capacitance ($C_{LL}$), or parasitic capacitance, is determined as follows:

$$C_{LL} = \epsilon T_c L / T_{d2},$$

wherein $\epsilon$ is the permittivity of the dielectric material between the conductors, $T_c$ is the conductor thickness, L is the conductor length, and $T_{d2}$ is the distance in which each conductor is dielectrically spaced from other conductors. Thus, as device dimensions and component spacing continues to shrink to meet increasing demands for smaller electronic devices, parasitic capacitance increases. This is undesirable because parasitic capacitance contributes to effects such as RC delay, power dissipation, and capacitively couples signals, also known as cross-talk. Therefore, it would be desirable to provide MOSFET structures having lower parasitic capacitance between conductors, as well as methods for making such MOSFET structures.

SUMMARY OF THE DISCLOSURE

The present disclosure provides MOSFET semiconductor structures having a reduced parasitic capacitance, and methods for fabricating these semiconductor structures. The MOSFET semiconductor structures of the instant disclosure comprise a plurality of voids between the contacts and the gate stack structures. Inclusion of the plurality of voids results in MOSFET semiconductor structures that exhibit a reduced parasitic capacitance.

One aspect of the present disclosure relates to a method of making a MOSFET semiconductor structure having reduced parasitic capacitance comprising:
  (a) obtaining a MOSFET device comprising:
    (i) a semiconductor substrate;
    (ii) a gate stack structure comprising: a gate dielectric structure on top of the semiconductor substrate; a conductive gate electrode having a top, a base, and two sidewalls; and a silicide layer on top of the conductive gate electrode;
    (iii) an oxide spacer that is adjacent to each of the two sidewalls of the conductive gate electrode;
    (iv) a nitride spacer that is adjacent to each of the oxide spacers;
    (v) a silicide layer that is on top of the semiconductor substrate and adjacent to each of the nitride spacers;
    (vi) a channel region formed in the semiconductor substrate below the conductive gate electrode and the gate dielectric structure;
    (vii) a plurality of source/drain regions formed in the semiconductor substrate directly below the silicide layer located on top of the semiconductor substrate and adjacent to each of the nitride spacers; and
    (ix) a plurality of shallow trench isolation regions formed in the semiconductor substrate adjacent to each of the source/drain regions;
  (b) depositing a contact etch stop liner over the gate stack structure, nitride spacers and silicide layers that are adjacent to each of the nitride spacers;
  (c) depositing a sacrificial interlayer dielectric material over the contact etch stop liner;
  (d) masking and etching the interlayer dielectric material to pattern a plurality of apertures corresponding to a plurality of contacts to the source/drain and gate stack structures;
  (e) depositing a lining material in the apertures corresponding to the contacts to the source/drain and gate stack structures;
  (f) forming a plurality of contacts to the source/drain and gate stack structures by depositing a conductive material in the lined apertures corresponding to the contacts to the source/drain and gate stack structures;
  (g) forming spaces between the contacts to the source/drain and gate stack structure by removing the sacrificial interlayer dielectric material;
  (h) selectively removing the contact etch stop liner and the oxide spacers;
  (i) selectively removing the nitride spacers;
  (j) forming voids between the contacts and the gate stack structure by depositing a non-conformal oxide in the spaces between the contacts and the gate stack structure; and
  (k) planarizing the non-conformal oxide using chemical mechanical polishing.

The contact etch stop liner typically comprises nitride. Also, the sacrificial interlayer dielectric material should be a material that is easily removable as compared to the other materials that are intended to remain permanently on the MOSFET semiconductor structure (e.g., the contacts, the gate stack structure, and the silicide layers).

Usually, photoresist materials are used to mask the interlayer dielectric material to pattern a plurality of apertures corresponding to the contacts to the source/drain and gate stack structures. The apertures corresponding to the contacts to the source/drain and gate stack structures are typically formed using a photolithography and dry-etch process. After these apertures are formed, a liner material (e.g., Ti/TiN) is deposited in the apertures, and then a conductive material (e.g., tungsten) is deposited into the lined apertures using a chemical vapor deposition (CVD) technique.

A second aspect of the present disclosure involves a method of making a MOSFET semiconductor structure having reduced parasitic capacitance comprising:
  (a) obtaining a MOSFET device comprising:
    (i) a semiconductor substrate;
    (ii) a gate stack structure comprising: a gate dielectric structure on top of the semiconductor substrate; a conductive gate electrode having a top, a base, and two sidewalls; and a silicide layer on top of the conductive gate electrode;
    (iii) an oxide spacer that is adjacent to each of the two sidewalls of the conductive gate electrode;
    (iv) a nitride spacer that is adjacent to each of the oxide spacers;
    (v) a silicide layer that is on top of the semiconductor substrate and adjacent to each of the nitride spacers;

(vi) a channel region formed in the semiconductor substrate below the conductive gate electrode and the gate dielectric structure;

(vii) a plurality of source/drain regions formed in the semiconductor substrate directly below the silicide layer located on top of the semiconductor substrate and adjacent to each of the nitride spacers; and (ix) a plurality of shallow trench isolation regions formed in the semiconductor substrate adjacent to each of the source/drain regions;

(b) depositing a contact etch stop liner over the gate stack structure, nitride spacer and silicide layers that are adjacent to each of the nitride spacers;

(c) depositing a sacrificial interlayer dielectric material over the contact etch stop liner;

(d) masking and etching the interlayer dielectric material to pattern a plurality of apertures corresponding to a plurality of contacts to the source/drain and gate structures;

(e) depositing a lining material in the apertures corresponding to the contacts to the source/drain and gate structures;

(f) forming a plurality of contacts to the source/drain and gate structures by depositing a conductive material in the lined apertures corresponding to the contacts to the source/drain and gate structures;

(g) forming spaces between the contacts and the gate stack structure by removing the sacrificial interlayer dielectric material;

(h) selectively removing the contact etch stop liner and the oxide spacers;

(i) selectively removing the nitride spacers;

(j) forming voids between the contacts and the gate stack structure by depositing a low dielectric material in the spaces between the contacts and the gate stack structure; and (k) planarizing the low dielectric material using chemical mechanical polishing.

The contact etch stop liner used in this method of the instant disclosure typically comprises nitride. Also, the sacrificial interlayer dielectric material should be a material that is easily removable as compared to the other materials that are intended to remain permanently on the MOSFET semiconductor structure (e.g., the contacts, the gate stack structure, and the silicide layers).

Usually, photoresist materials are used to mask the interlayer dielectric material to pattern a plurality of apertures corresponding to a plurality of contacts to the source/drain and gate stack structures. The apertures corresponding to the contacts to the source/drain and gate stack structures are typically formed using a photolithography and dry-etch process. After these apertures are formed, a liner material (e.g., Ti/TiN) is deposited, and then a conductive material (e.g., tungsten) is deposited into the lined apertures using a chemical vapor deposition (CVD) technique.

Typically, the voids between the contacts to the source/drain and gate structures and the gate stack structure are formed by depositing a low dielectric film (e.g., SiCOH or fluorinated oxide film) in the spaces between the contacts and the gate stack structure using a chemical vapor deposition (CVD) method.

The conditions used for the chemical vapor deposition (CVD) vary depending on the desired final dielectric constant of the low dielectric film. For instance, when SiCOH is deposited, the chemical vapor deposition is conducted at a temperature of about 300° Celsius to about 400° Celsius, and the pressure is about 4 to about 10 Torr. The first precursor (e.g., "TMCTS" or "$C_4H_{16}O_4Si_4$") flow rate is about 2000 to about 3000 milligrams/minute. Furthermore, the oxidizing agent (e.g., $O_2$) flow rate is about 200 to about 300 standard cubic centimeters per minute, the flow rate of the inert carrier gases (e.g., He or Ar) is about 700 to about 1200 standard cubic centimeters per minute; the high frequency RF power is about 250 to about 500 watts; and the low frequency power is about 40 to about 80 watts.

Yet another aspect of the disclosure relates to a method of making a MOSFET having reduced parasitic capacitance comprising:

(a) obtaining a MOSFET device comprising:

(i) a semiconductor substrate;

(ii) a gate stack structure comprising: a gate dielectric structure on top of the semiconductor substrate; a conductive gate electrode having a top, a base, and two sidewalls; and a silicide layer on top of the conductive gate electrode;

(iii) an oxide spacer that is adjacent to each of the two sidewalls of the conductive gate electrode;

(iv) a nitride spacer that is adjacent to each of the oxide spacers;

(v) a silicide layer that is on top of the semiconductor substrate and adjacent to each of the nitride spacers;

(vi) a channel region formed in the semiconductor substrate below the conductive gate electrode and the gate dielectric structure;

(vii) a plurality of source/drain regions formed in the semiconductor substrate directly below the silicide layer located on top of the semiconductor substrate and adjacent to each of the nitride spacers; and (ix) a plurality of shallow trench isolation regions formed in the semiconductor substrate adjacent to each of the source/drain regions;

(b) depositing a contact etch stop liner over the gate stack structure, nitride spacer and silicide layers that are adjacent to each of the nitride spacers;

(c) depositing a sacrificial interlayer dielectric material over the contact etch stop liner;

(d) masking and etching the interlayer dielectric material to pattern a plurality of apertures corresponding to a plurality of contacts to the source/drain and gate stack structures;

(e) depositing a lining material into the apertures corresponding to the contacts to the source/drain and gate stack structures;

(f) forming a plurality of contacts to the source/drain and gate stack structures by depositing a conductive material in the lined apertures;

(g) forming spaces between the contacts and the gate stack structure by removing the sacrificial interlayer dielectric material;

(h) selectively removing the contact etch stop liner and the oxide spacers;

(i) selectively removing the nitride spacers;

(j) forming voids between the contacts and the gate stack structure by depositing a low dielectric material in the spaces between the contacts and the gate stack structure such that a top of the low dielectric material is taller than a top of the contacts;

(k) masking and etching the low dielectric material above the contacts to the source/drain structures to define a plurality of M1 structures;

(l) removing the masking material;

(m) depositing a liner over the entire MOSFET device;

(n) plating the M1 structures with Cu; and (o) planarizing the Cu using chemical mechanical polishing.

The contact etch stop liner used in this method of the instant disclosure usually comprises nitride. Also, the sacrificial interlayer dielectric material should be a material that is easily removable as compared to the other materials that are intended to remain permanently on the MOSFET semiconductor structure (e.g., the contacts, the gate stack structure, and the silicide layers).

Usually, photoresist materials are used to mask the interlayer dielectric material to pattern a plurality of contacts to the source/drain and gate structures. The apertures corresponding to the contacts to the source/drain and gate structures are typically formed using a photolithography and dry-etch process. After these apertures are formed, a liner material (e.g., Ti/TiN) is deposited, and then a conductive material (e.g., tungsten) is deposited into the lined apertures using a chemical vapor deposition (CVD) technique.

Once the M1 structures are formed, the masking material is removed, and a liner is deposited over the entire MOSFET device. The M1 structures are then plated with Cu, or any other suitable plating metal. Typically, the Cu and liner materials are removed from the horizontal regions of the MOSFET device by a chemical mechanical polishing method so that the Cu and liner materials remain in the trenches. The remaining Cu is then planarized using a chemical mechanical polishing technique.

A fourth aspect of the disclosure relates to a method of making a MOSFET having reduced parasitic capacitance comprising:
  (a) obtaining a MOSFET device comprising:
    (i) a semiconductor substrate;
    (ii) a gate stack structure comprising: a gate dielectric structure on top of the semiconductor substrate; a conductive gate electrode having a top, a base, and two sidewalls; and a silicide layer on top of the conductive gate electrode;
    (iii) an oxide spacer that is adjacent to each of the two sidewalls of the conductive gate electrode;
    (iv) a nitride spacer that is adjacent to each of the oxide spacers;
    (v) a silicide layer that is on top of the semiconductor substrate and adjacent to each of the nitride spacers;
    (vi) a channel region formed in the semiconductor substrate below the conductive gate electrode and the gate dielectric structure;
    (vii) a plurality of source/drain regions formed in the semiconductor substrate directly below the silicide layer located on top of the semiconductor substrate and adjacent to each of the nitride spacers; and
    (ix) a plurality of shallow trench isolation regions formed in the semiconductor substrate adjacent to each of the source/drain regions;
  (b) depositing a contact etch stop liner over the gate stack structure, nitride spacer, and silicide regions that are adjacent to the nitride spacers;
  (c) depositing a sacrificial interlayer dielectric material over the contact etch stop liner;
  (d) masking and etching the interlayer dielectric material to pattern a plurality of apertures corresponding to a plurality of contacts to the source/drain and gate stack structures;
  (e) depositing a lining material in the apertures corresponding to the contacts to the source/drain and gate stack structures;
  (f) forming a plurality of contacts to the source/drain and gate stack structures by depositing a conductive material in the lined apertures;
  (g) placing a block mask over the sacrificial interlayer dielectric material that is above the shallow trench isolation regions;
  (h) forming spaces between the contacts and the gate stack structure by removing a portion of the sacrificial interlayer dielectric material that remains uncovered by the block mask;
  (i) selectively removing the contact etch stop liner and the oxide spacers;
  (j) selectively removing the nitride spacers;
  (k) forming voids between the contacts and the gate stack structure by depositing a low dielectric constant material in the spaces between the contacts and the gate stack structure;
  (l) planarizing the low dielectric material using chemical mechanical polishing;
  (m) removing the block mask over the sacrificial interlayer dielectric material that is above the shallow trench isolation regions;
  (n) depositing a second layer of low dielectric material above the contacts to the source/drain structures;
  (o) masking and etching the low dielectric material above the contacts to the source/drain structures to define a plurality of M1 structures;
  (p) removing the masking material;
  (q) depositing a liner over the entire MOSFET semiconductor structure;
  (r) plating the M1 structures with Cu; and
  (s) planarizing the Cu using chemical mechanical polishing.

The contact etch stop liner used in this aspect of the disclosure typically comprises nitride. Also, the sacrificial interlayer dielectric material should be a material that is easily removable as compared to the other materials that are intended to remain permanently on the MOSFET semiconductor structure (e.g., the contacts, the gate stack structure, and the silicide layers).

Usually, photoresist materials are used to mask the interlayer dielectric material to pattern a plurality of contacts to the source/drain and gate stack structures. The apertures corresponding to the contacts to the source/drain and gate stack structures are typically formed using a photolithography and dry-etch process. After these apertures are formed, the contacts to the source/drain and gate stack structures are formed by depositing a liner material (e.g., Ti/TiN), and then depositing a conductive material (e.g., tungsten) into the apertures using a chemical vapor deposition (CVD) technique.

The block mask is placed over the sacrificial interlay dielectric material above the shallow trench isolation regions in order to preserve the interlayer dielectric material in these areas. Indeed, the space above the shallow trench isolations regions require more mechanical stability as compared to the areas of the MOSFET semiconductor structure wherein the contacts to the source/drain and gate structures are more tightly spaced (i.e., the areas above the gate stack structure and contacts). Voids are unnecessary in the space above the shallow trench isolation regions because gate-to-contact capacitance is not a concern (i.e., because there are no gate stack structures or contacts in these areas).

After the block mask has been placed over the sacrificial interlayer dielectric material above the shallow trench isolation regions, the portion of sacrificial interlayer dielectric material that remains uncovered by the block mask is removed to form spaces between the contacts and the gate stack structure. Next, the contact etch stop liner, oxide spacers, and nitride spacers are all selectively removed. Voids are then formed between the contacts and the gate stack structure by depositing a low dielectric material in the spaces between the contacts and the gate stack structure.

Once the low dielectric material has been deposited, it is planarized so that it is co-planar with the sacrificial dielectric material that is above the shallow trench isolation regions. Next, the block mask is removed. Removal is selective for the block mask over the low dielectric material and the sacrificial interlayer dielectric material beneath the block mask.

A second layer of low dielectric material is then deposited above the contacts to the source/drain structures, and this dielectric material is masked and etched to define a plurality of M1 structures.

Once the M1 structures are formed, the masking material is removed, and a liner material (e.g., Ti/TiN) is deposited over the entire MOSFET device. The M1 structures are then plated with Cu, or any other suitable plating metal. Typically, the Cu and liner materials are then removed from the horizontal regions of the MOSFET device by a chemical mechanical polishing method so that the Cu and liner materials remain in the trenches. The remaining Cu is then planarized using a chemical mechanical polishing technique.

Lastly, another aspect of the present disclosure involves a method of making a MOSFET having reduced parasitic capacitance comprising:
  (a) obtaining a MOSFET device comprising:
    (i) a semiconductor substrate;
    (ii) a gate stack structure comprising: a gate dielectric structure on top of the semiconductor substrate; a conductive gate electrode having a top, a base, and two sidewalls; and a silicide layer on top of the conductive gate electrode;
    (iii) an oxide spacer that is adjacent to each of the two sidewalls of the conductive gate electrode;
    (iv) a nitride spacer that is adjacent to each of the oxide spacers;
    (v) a silicide layer that is on top of the semiconductor substrate and adjacent to each of the nitride spacers;
    (vi) a channel region formed in the semiconductor substrate below the conductive gate electrode and the gate dielectric structure;
    (vii) a plurality of source/drain regions fanned in the semiconductor substrate directly below the silicide layer located on top of the semiconductor substrate and adjacent to each of the nitride spacers; and
    (ix) a plurality of shallow trench isolation regions formed in the semiconductor substrate adjacent to each of the source/drain regions;
  (b) depositing a contact etch stop liner over the gate stack structure, nitride spacer, and silicide regions that are adjacent to the nitride spacers;
  (c) depositing a sacrificial interlayer dielectric material over the contact etch stop liner;
  (d) masking and etching the interlayer dielectric material to pattern a plurality of apertures corresponding to a plurality of contacts to the source/drain and gate stack structures;
  (e) depositing a lining material in the apertures corresponding to the contacts to the source/drain and gate stack structures;
  (f) forming a plurality of contacts to the source/drain and gate stack structures by depositing a conductive material in the lined apertures corresponding to the contacts to the source/drain and gate stack structures;
  (g) placing a block mask over the sacrificial interlayer dielectric material that is above the shallow trench isolation regions;
  (h) forming spaces between the contacts and the gate stack structure by removing a portion of the sacrificial interlayer dielectric material that remains uncovered by the block mask;
  (i) selectively removing the contact etch stop liner and the oxide spacers;
  (j) selectively removing the nitride spacers;
  (k) forming voids between the contacts and the gate stack structure by depositing a low dielectric material in the spaces between the contacts and gate stack structures such that a top of the low dielectric material is taller than a top of the contacts;
  (l) planarizing the low dielectric material using chemical mechanical polishing;
  (m) removing the block mask over the sacrificial interlayer dielectric material that is above the shallow trench isolation regions;
  (n) masking and etching the low dielectric material above the contacts to the source/drain structures to define a plurality of M1 structures;
  (o) removing the masking material;
  (p) depositing a liner over the low dielectric material;
  (q) plating the M1 structures with Cu; and
  (r) planarizing the Cu using chemical mechanical polishing.

The contact etch stop liner used in this aspect of the disclosure typically comprises nitride. Also, the sacrificial interlayer dielectric material should be a material that is easily removable as compared to the other materials that are intended to remain permanently on the MOSFET semiconductor structure (e.g., the contacts, the gate stack structure, and the silicide layers).

Usually, photoresist materials are used to mask the interlayer dielectric material to pattern a plurality of contacts to the source/drain and gate stack structures. The apertures corresponding to the contacts to the source/drain and gate stack structures are typically formed using a photolithography and dry-etch process. After these apertures are formed, the contacts to the source/drain and gate stack structures are formed by depositing a liner material (e.g., Ti/TiN), and then depositing a conductive material (e.g., tungsten) into the apertures using a chemical vapor deposition (CVD) technique.

The block mask is placed over the sacrificial interlay dielectric material above the shallow trench isolation regions in order to preserve the interlayer dielectric material in these areas. Indeed, the space above the shallow trench isolations regions require more mechanical stability as compared to the areas of the MOSFET semiconductor structure wherein the contacts to the source/drain and gate structures are more tightly spaced (i.e., the areas above the gate stack structure and contacts). Voids are unnecessary in the space above the shallow trench isolation regions because gate-to-contact capacitance is not a concern (i.e., because there are no gate stack structures or contacts in these areas).

After the block mask has been placed over the sacrificial interlayer dielectric material above the shallow trench isolation regions, the portion of sacrificial interlayer dielectric material that remains uncovered by the block mask is removed to form spaces between the contacts and the gate stack structure. Next, the contact etch stop liner, oxide spacers, and nitride spacers are all selectively removed. Voids are then formed between the contacts and the gate stack structure by depositing a low dielectric material in the spaces between the contacts and the gate stack structure.

The low dielectric material is then planarized, and the block mask is removed. Removal is selective for the block mask over the low dielectric material and the sacrificial interlayer dielectric material beneath the block mask. Next, the low dielectric material above the contacts to the source/drain structures is masked and etched to define a plurality of M1 structures.

Once the M1 structures are formed, the masking material is removed, and a liner material (e.g., Ti/TiN) is deposited over the low dielectric material. The M1 structures are then plated with Cu, or any other suitable plating metal. The Cu and liner materials are then typically removed from the horizontal regions of the MOSFET device by a chemical mechanical polishing method so that the Cu and liner materials remain in the trenches. The remaining Cu is then planarized using a chemical mechanical polishing technique.

DESCRIPTION OF BEST AND VARIOUS EMBODIMENTS OF DISCLOSURE

Figure 1:
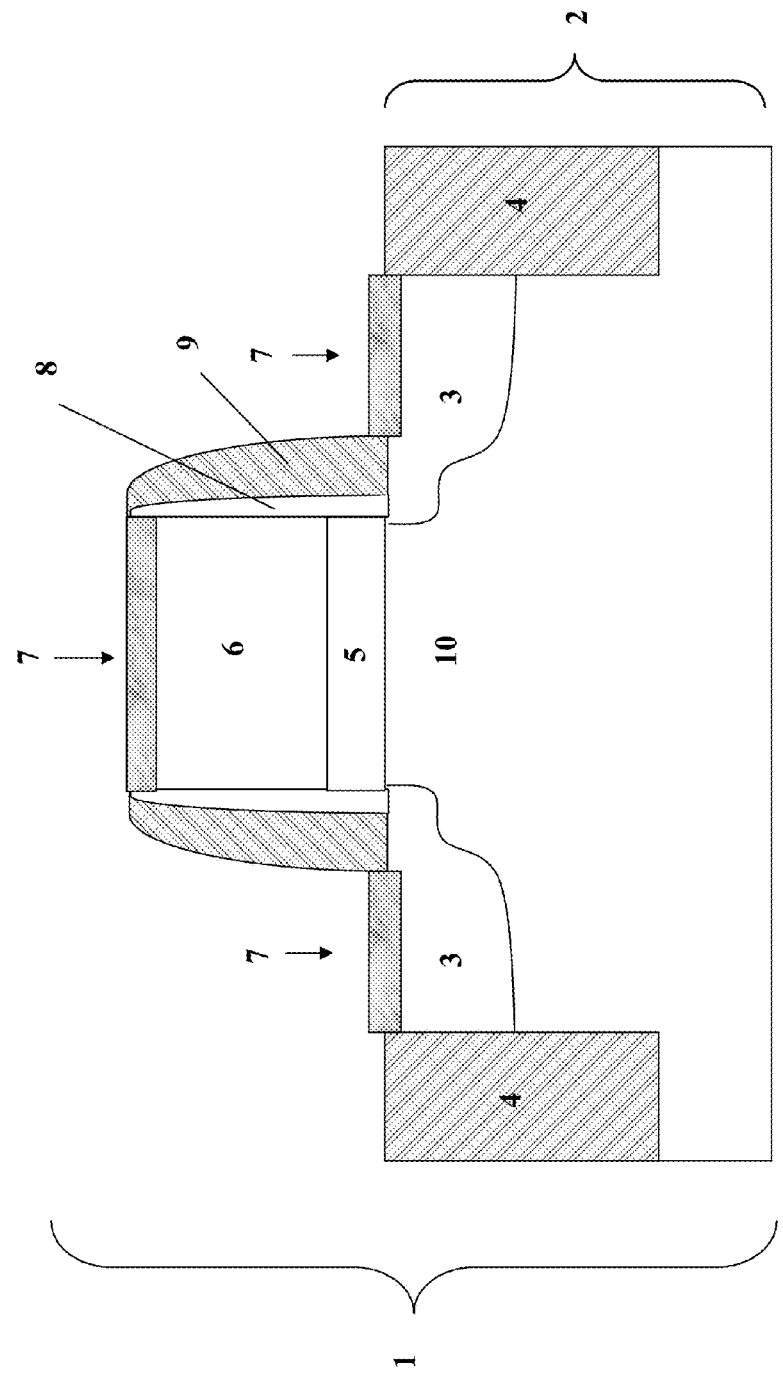
FIG. 1 is a pictorial representation (through a cross-sectional view) of a MOSFET semiconductor structure used in the methods of the instant disclosure.

The present disclosure, which is directed to MOSFET semiconductor structures having a reduced parasitic capacitance, and methods for fabricating these MOSFET semiconductor structure, will now be described in greater detail by referring to the drawings that accompany the present application. It is noted that in the accompanying drawings, like reference numerals are used for describing like and/or corresponding elements.

Reference is first made to FIGS. 1-7 which illustrate one method of fabricating the MOSFET semiconductor structure of the present disclosure. FIG. 1 depicts a MOSFET semiconductor structure 1 that can be used in the methods of the instant disclosure. The MOSFET semiconductor structure comprises a semiconductor substrate 2; a plurality of source and drain regions 3, and shallow trench isolation (STI) regions 4 formed within the semiconductor substrate 2; a gate dielectric structure 5 on top of the semiconductor substrate 2; a conductive gate electrode 6 having a top, a base, and two sidewalls; a silicide layer 7 on top of the conductive gate electrode 6; an oxide spacer 8 that is adjacent to each of the two sidewalls of the conductive gate electrode 6; a nitride spacer 9 that is adjacent to each of the oxide spacers 8; a silicide layer 7 that is on top of the semiconductor substrate 2 and adjacent to each of the nitride spacers 9; and a channel region 10 formed in the semiconductor substrate below the conductive gate electrode and the gate dielectric structure.

The semiconductor substrate 2 may comprise any of several semiconductor materials. Non-limiting examples include silicon, germanium, silicon-germanium alloy, silicon-carbonyl alloy, silicon-germanium-carbon alloy and compound (e.g., III-V and II-VI) semiconductor materials. Non-limiting examples of compound semiconductor materials include gallium arsenide, indium arsenide and indium phosphide semiconductor materials. Typically, the semiconductor substrate 2 has a conventional thickness.

The MOSFET semiconductor structures 1 of the instant disclosure may also comprise a semiconductor-on-insulator (SOI) substrate. Such a semiconductor-on-insulator (SOI) substrate typically comprises a base semiconductor substrate, a buried dielectric layer located upon the base semiconductor substrate, and a surface semiconductor layer located upon the buried dielectric layer.

The gate dielectric 5 may comprise conventional dielectric materials such as oxides, nitrides, and oxynitrides of silicon that have a dielectric constant from about 4 (e.g., typically a silicon oxide) to about 8 (e.g., typically a silicon nitride), measured in vacuum. Alternatively, the gate dielectric 5 may comprise generally higher dielectric constant materials having a dielectric constant from about 8 to at least 100. Such higher dielectric constant materials may include, but are not limited to hafnium oxides, hafnium silicates, zirconium oxides, lanthanum oxides, titanium oxides, barium-strontium-titanates (BSTs) and lead-zirconate-titanates (PZTs).

The gate dielectric 5 may be formed using any of several methods that are appropriate to its material of composition. For example, the gate dielectric 5 may be formed using thermal or plasma oxidation or nitridation methods, chemical vapor deposition methods (including atomic layer deposition methods) and physical vapor deposition methods. The gate dielectric 5 usually comprises a thermal silicon oxide dielectric material that has a conventional thickness that may be in a range from about 10 to about 70 angstroms.

The conductive gate electrode 6 may comprise a metal-containing material such as titanium metal, a tantalum metal, a tungsten metal, or an alloy thereof. Alternatively, a silicide of the foregoing metals or a nitride of the foregoing metals may also be used. The conductive gate electrode 6 may be formed using generally conventional methods. For instance, the conductive gate electrode 6 may be formed using plating methods, chemical vapor deposition methods, and physical vapor deposition methods. The conductive gate electrode 6 is typically selected based on a desirable work function, and generally has a thickness of from about 100 to about 300 angstroms.

The oxide spacer 8 is adjacent to each of the two sidewalls of the conductive gate electrode. The oxide spacer 8 is typically formed using a blanket layer deposition and anisotropic etchback method that uses an anisotropic etching plasma for etching purposes.

The nitride spacer 9 is adjacent to each of the oxide spacers. The nitride spacer 9 may be formed using methods and materials generally analogous, equivalent or identical to the methods and materials used for forming the oxide spacer 8.

The MOSFET semiconductor structure 1 used in the methods of the instant disclosure also comprises a plurality of source and drain regions 3 formed within the semiconductor substrate 2. As is understood by a person skilled in the art, the plurality of source and drain regions 3 is formed using a two-step ion implantation method. Dopant concentrations within the source and drain regions 3 are provided at generally conventional levels.

Next, the plurality of source and drain regions 3, as well as the conductive gate electrode 6, are salicided. To form the silicides 7, a layer of metal (e.g., titanium, cobalt, nickel, or tantalum) is sputter-deposited over the surface of the substrate. The layer of metal is then annealed using a rapid thermal annealing (RTA) technique. The metal layer overlying the plurality of source and drain regions 3, as well as the metal layer overlying the conductive gate electrode 6, is transformed by the annealing process to a silicide layer 7. Any unreacted metal is then removed.

Figure 2:
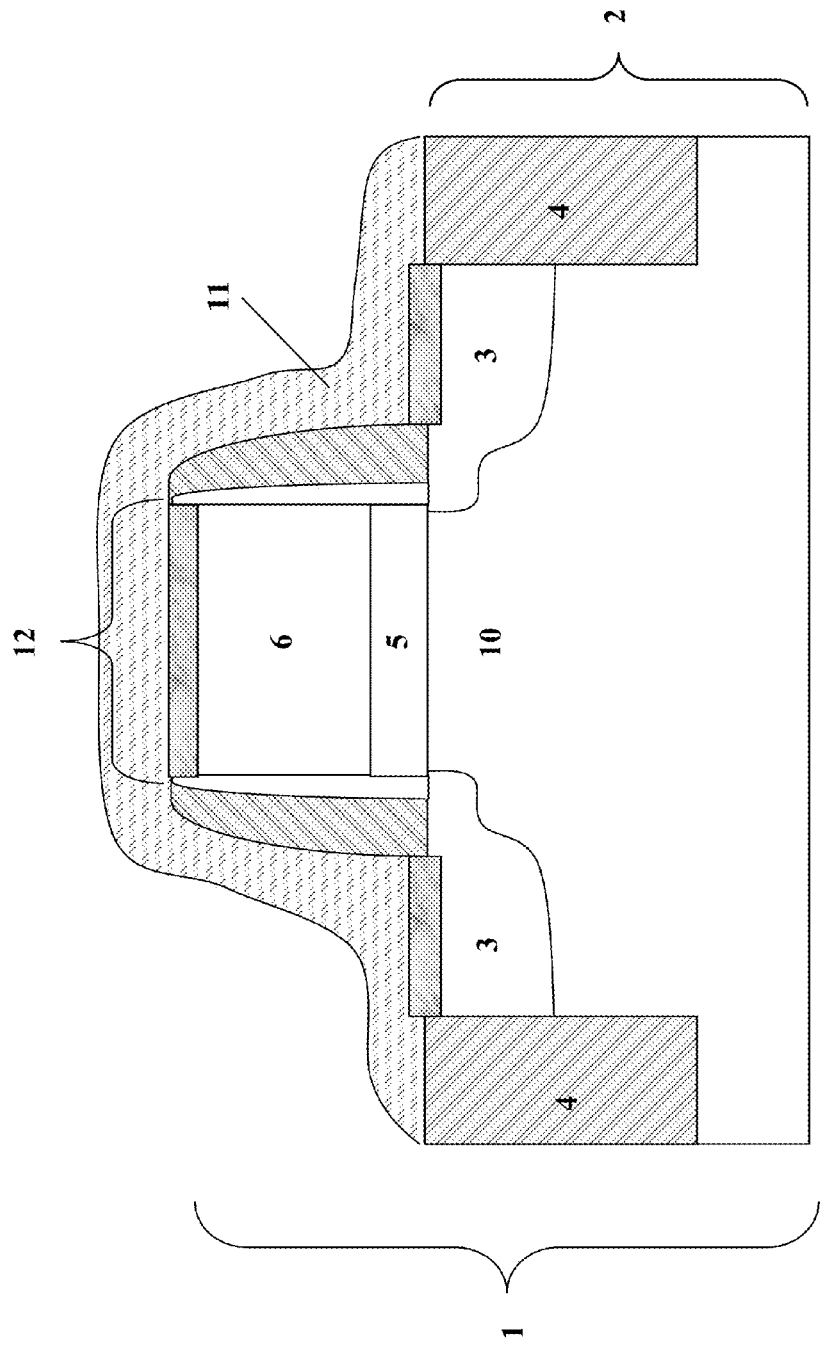
FIG. 2 is a pictorial representation (through a cross-sectional view) of the MOSFET semiconductor structure of FIG. 1 after deposition of a contact etch stop liner over the gate stack structure, nitride spacers and silicide layers.

Once a MOSFET semiconductor structure 1 is obtained, a contact etch stop liner 11 is deposited conformally within the shallow trench isolation (STI) regions 4 and over the gate stack structure 12 as shown in FIG. 2. The contact etch stop liner 11 typically comprises silicon nitride or silicon oxynitride, and is deposited by low pressure chemical vapor deposition (LPCVD). The contact etch stop liner 11 is deposited to a thickness of about 50 to about 300 Angstroms.

Figure 3:
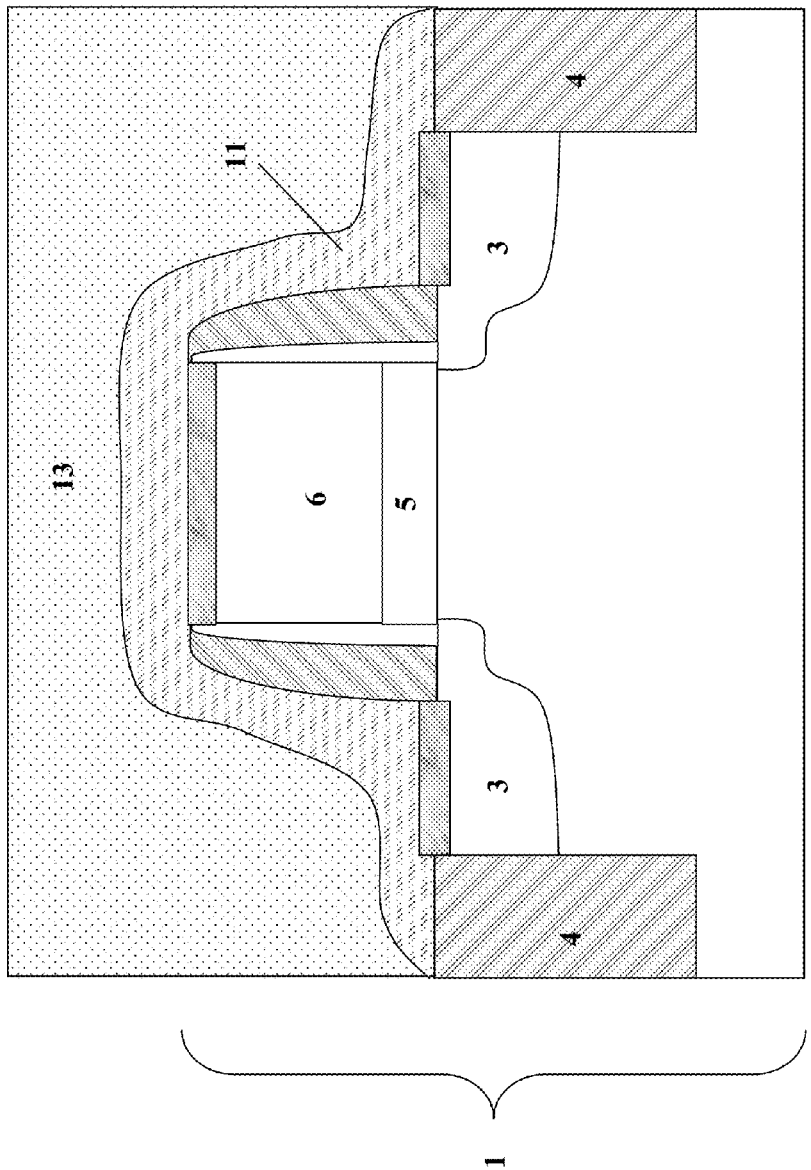
FIG. 3 is a pictorial representation (through a cross-sectional view) of the MOSFET semiconductor structure of FIG. 2 after deposition of a sacrificial interlayer dielectric material over the MOSFET semiconductor structure.

FIG. 3 depicts the MOSFET semiconductor structure of the instant disclosure after the sacrificial interlayer dielectric material 13 has been applied. The sacrificial interlayer dielectric material 13 is deposited over the entire MOSFET semiconductor structure 1 using thermal or plasma oxidation or nitridation methods, spin-coating methods, chemical vapor deposition methods, or physical vapor deposition methods. The sacrificial interlayer dielectric material 13 comprises several apertures to allow access to the plurality of source and drain regions 3. Furthermore, the dielectric material 13 may comprise one or more dielectric materials such as oxides, nitrides, and/or oxynitrides of silicon. Most typically, materials that are easily removable as compared to the other materials that are intended to remain permanently on the MOSFET semiconductor structure (e.g., the contacts, the gate stack, and the silicide layers) are used. Oxides, nitrides and oxynitrides of other elements are not excluded. The sacrificial interlayer dielectric materials 13 used in the methods of the instant disclosure typically have a dielectric constant that is less than about 4.0.

Figure 4:
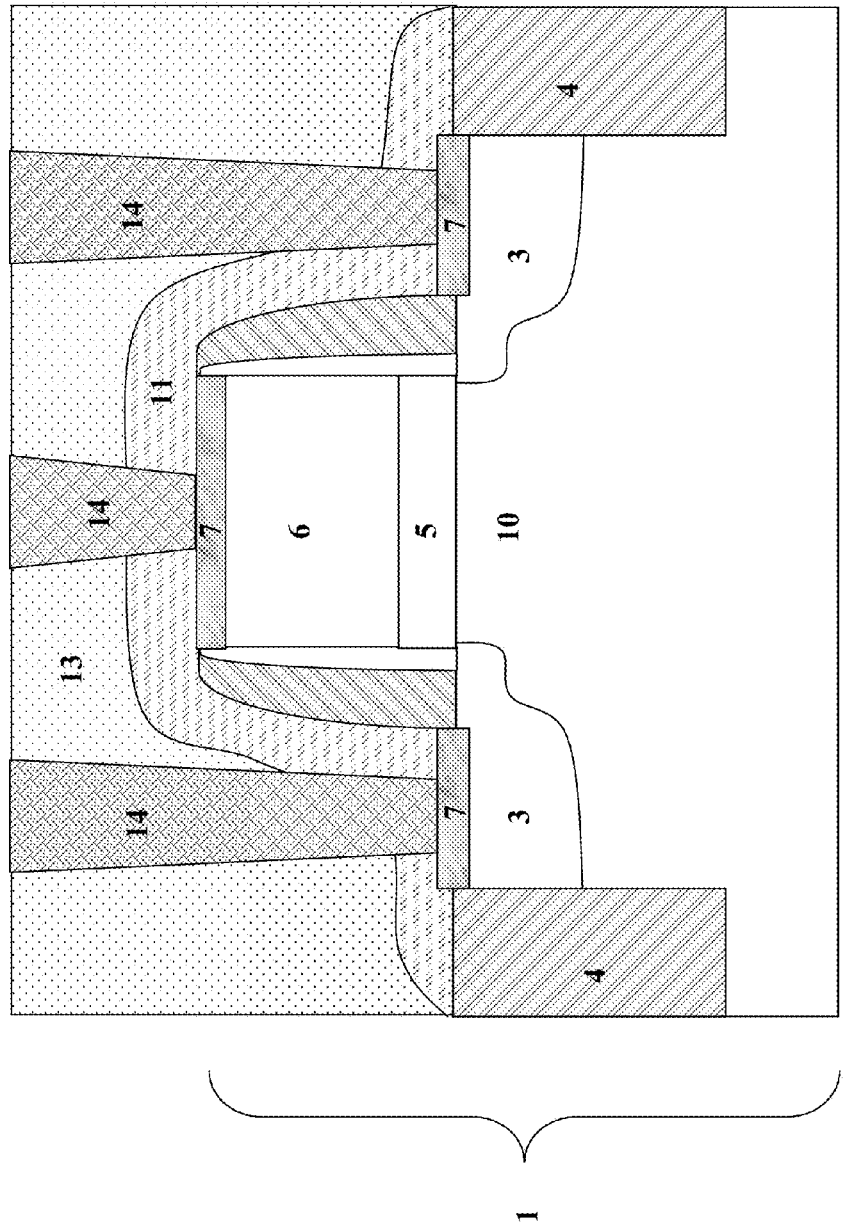
FIG. 4 is a pictorial representation (through a cross-sectional view) of the MOSFET semiconductor structure of FIG. 3 after the sacrificial interlayer dielectric material has been masked and etched to pattern a plurality of contacts to the source/drain and gate stack structures.

FIG. 4 illustrates the MOSFET semiconductor structures 1 of FIG. 3 after the interlayer dielectric material 13 has been masked and etched to pattern a plurality of apertures corresponding with a plurality of contacts 14 to the source/drain 3 and gate stack 12 structures. Usually, photoresist materials are used to mask the interlayer dielectric material to pattern a plurality of apertures corresponding to the contacts 14 to the source/drain 3 and gate stack 12 structures. The apertures corresponding to the contacts 14 are typically formed using a photolithography and dry-etch process. After the apertures are formed, a suitable liner material (e.g., Ti/TiN) is deposited into the apertures, and then a conductive material (e.g., tungsten) is deposited into the lined apertures using a chemical vapor deposition (CVD) process to form a plurality of contacts to the source/drain and gate stack structures. A chemical mechanical polishing process is then used to remove excess tungsten from any areas outside of the contacts 14 so that tungsten only remains inside the plurality of apertures corresponding to the contacts 14. The contacts 14 to the source/drain 3 and gate stack 12 structures are formed over silicided regions 7 of the MOSFET semiconductor structure 1.

Figure 5:
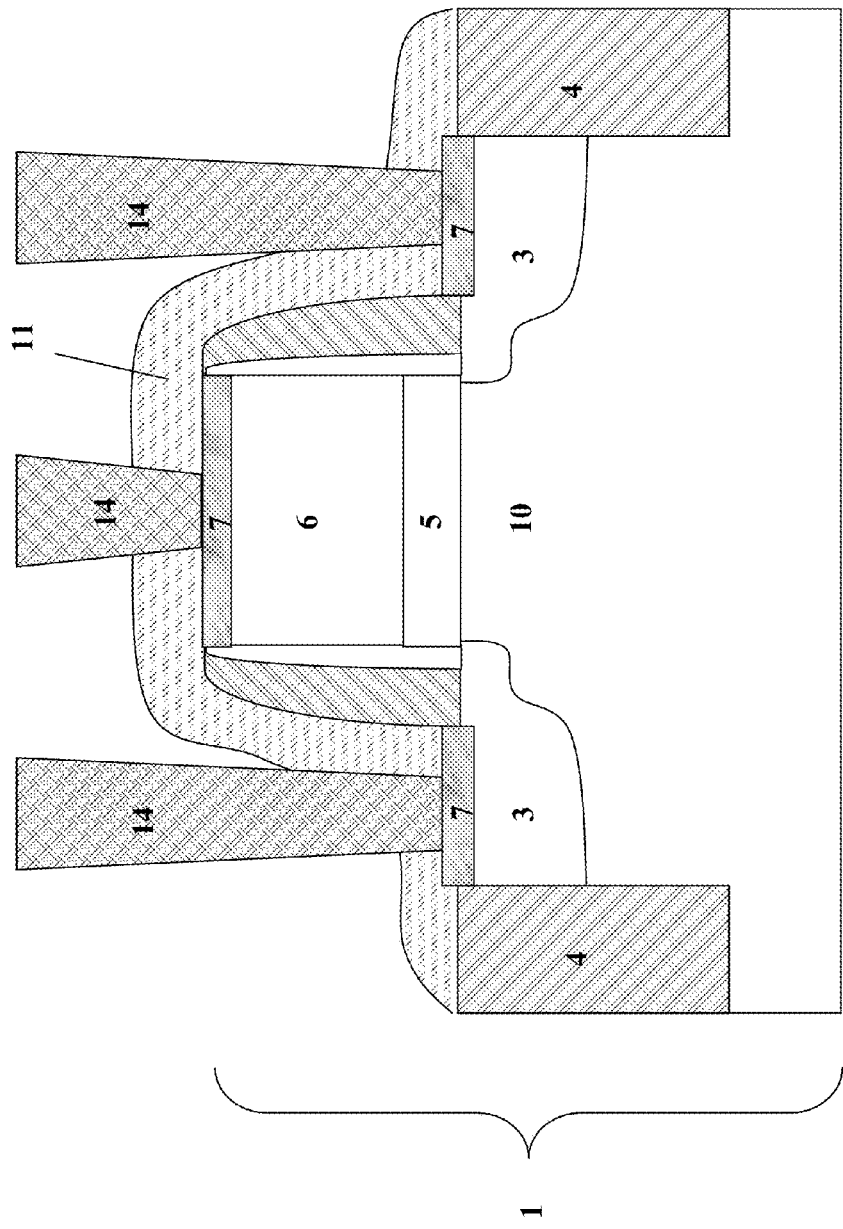
FIG. 5 is a pictorial representation (through a cross-sectional view) of the MOSFET semiconductor structure of FIG. 4 after spaces between the contacts to the source/drain and gate stack structure have been formed by removing the sacrificial interlayer dielectric material.

FIG. 5 shows the MOSFET semiconductor structure 1 of FIG. 4 after spaces between the contacts 14 and the gate stack structure 12 have been formed by removing the sacrificial interlayer dielectric material 13. Removal of the sacrificial interlayer dielectric material 13 is selective so that removal stops on the contact etch stop liner 11.

Figure 6:
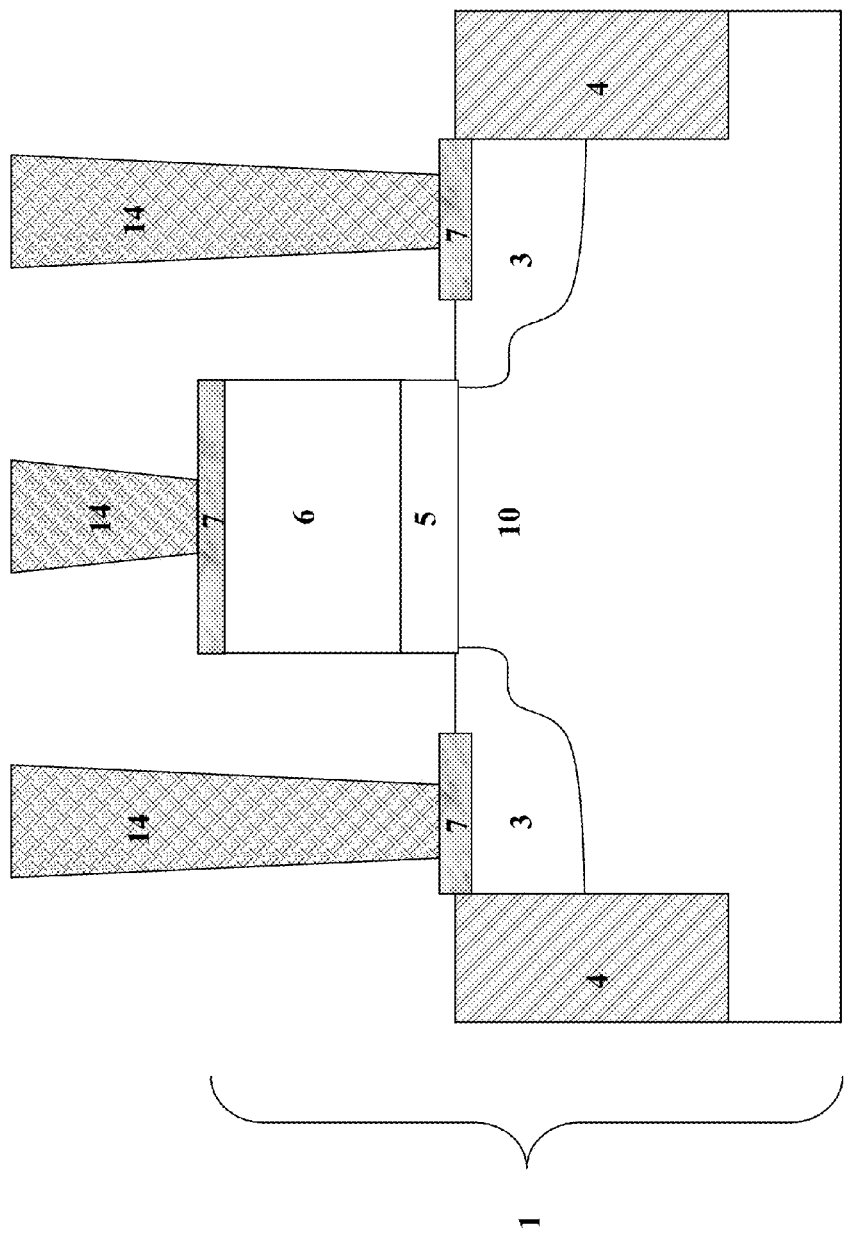
FIG. 6 is a pictorial representation (through a cross-sectional view) of the MOSFET semiconductor structure of FIG. 5 after the contact etch stop liner, nitride spacers, and oxide spacers have all been removed.

FIG. 6 shows the MOSFET semiconductor structure 1 of FIG. 5 after the contact etch stop liner 11, oxide spacer 8, and nitride spacer 9 have all been removed. The contact etch stop liner 11, oxide spacer 8, and nitride spacer 9 are all removed using an etching technique such as anisotropic etching or dry etching processes. Etching of the sacrificial interlayer dielectric material 13, contact etch stop liner 11, oxide spacer 8, and nitride spacer 9 is conducted selectively to expose the contacts 14 and the gate stack structure 12.

Figure 7:
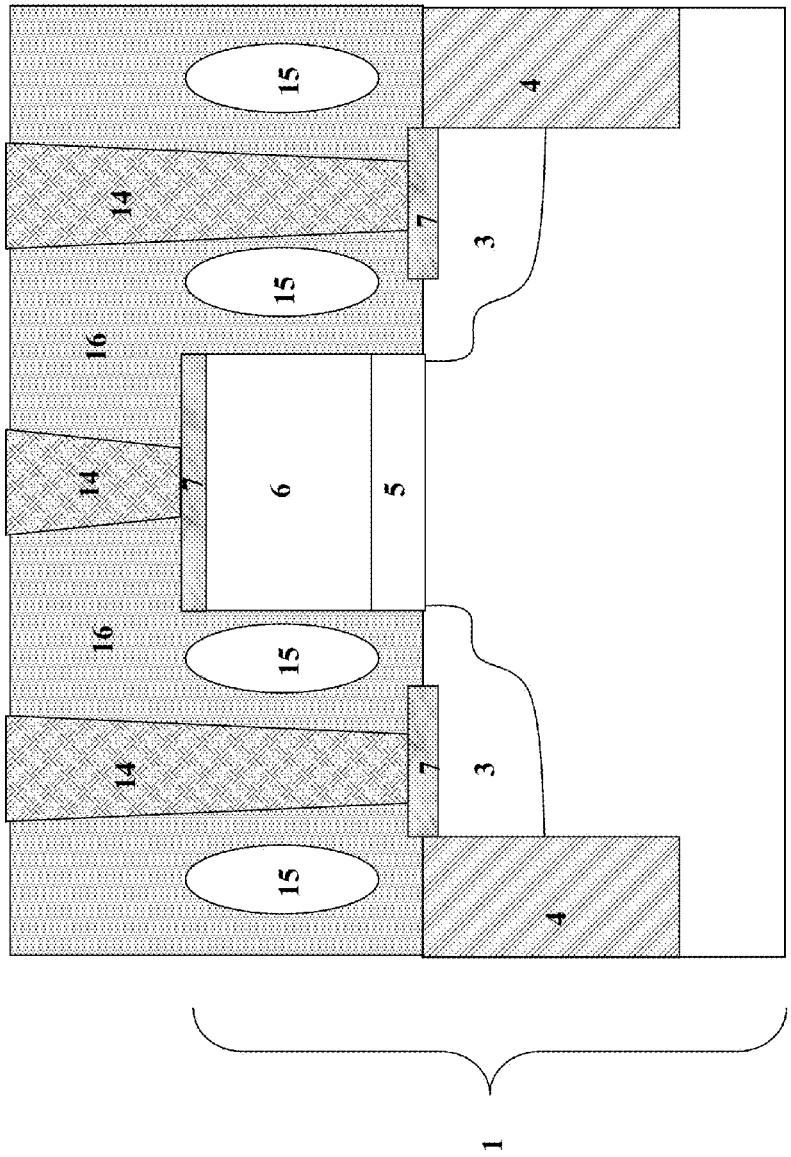
FIG. 7 is a pictorial representation (through a cross-sectional view) of the MOSFET semiconductor structure of FIG. 6 after formation of voids between the contacts and the gate stack structure. The voids are formed via a deposition of a non-conformal oxide, or a low dielectric material, in the spaces between the contacts and the gate stack structure.

FIG. 7 demonstrates the MOSFET semiconductor structure 1 of FIG. 6 after voids 15 have been formed between the contacts 14 and the gate stack structure 12. In one aspect of the present disclosure, the voids 15 are formed by depositing a non-conformal oxide 16 (e.g., PECVD oxide or ozone tetra ethyl oxysilane) in the spaces between the contacts 14 and the gate stack structure 12.

Figure 8:
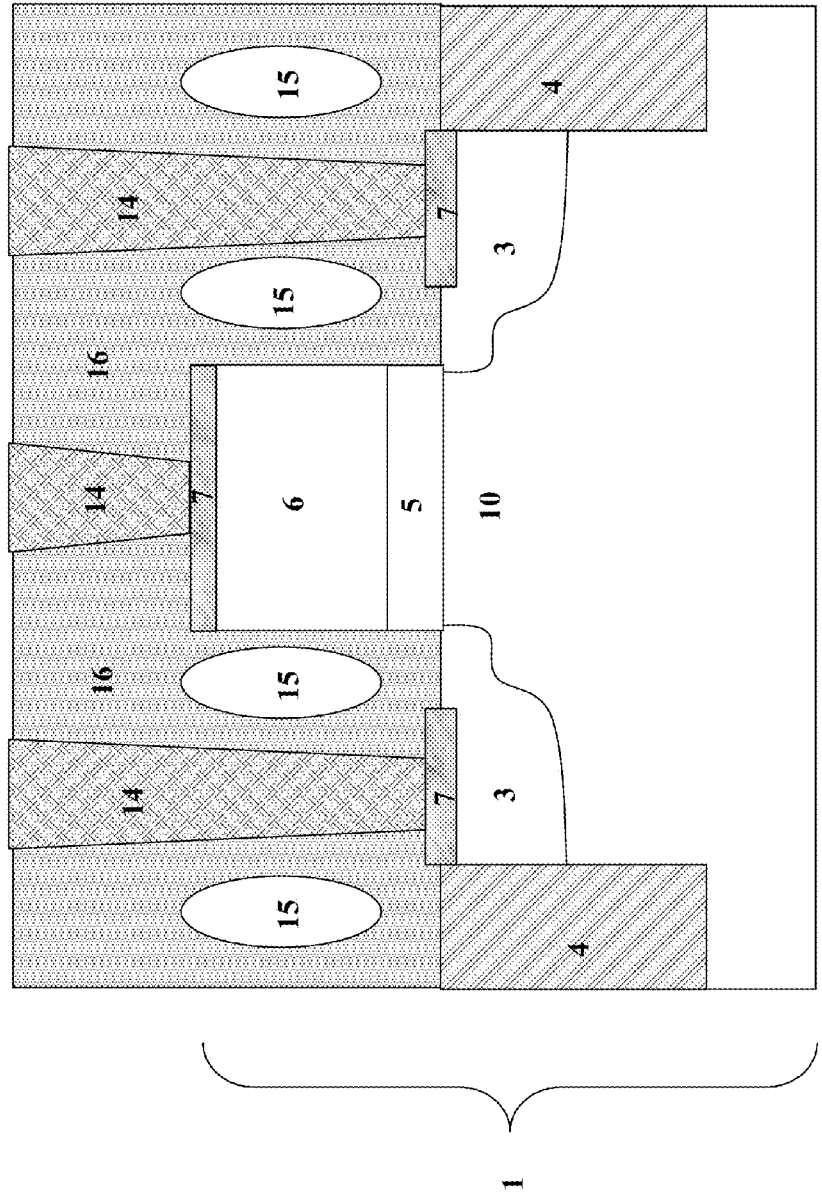
FIG. 8 is a pictorial representation (through a cross-sectional view) of the MOSFET semiconductor structure of FIG. 6 after voids have been formed between the contacts and the gate stack structure by deposition of a low dielectric material (e.g., SiCOH) above the contacts to the source/drain and gate stack structure and the gate stack structure.

FIG. 8 depicts another aspect of the present disclosure, wherein the voids 15 are formed by depositing a low dielectric material 16 in the spaces between the contacts 14 to the source/drain 3 and gate stack structures 12 and the gate stack structure 12. The low dielectric material 16 is usually deposited using a chemical vapor deposition (CVD) technique. The conditions used for chemical vapor deposition vary depending on the desired final dielectric constant of the low-dielectric film. For instance, when SiCOH is used as the low-dielectric film material 16, chemical vapor deposition is conducted at a temperature of about 300° Celsius to about 400° Celsius, and a pressure of about 4 to about 10 Torr. The first precursor (e.g., "TMCTS" or "$C_4H_{16}O_4Si_4$") flow rate is about 2000 to about 3000 milligrams/minute; the flow rate of the oxidizing agent (e.g., $O_2$) is about 200 standard cubic centimeters per minute to about 300 standard cubic centimeters per minute; the high frequency RF power is about 240 watts to about 500 watts; and the low frequency power is about 40 to about 80 watts.

Figure 9:
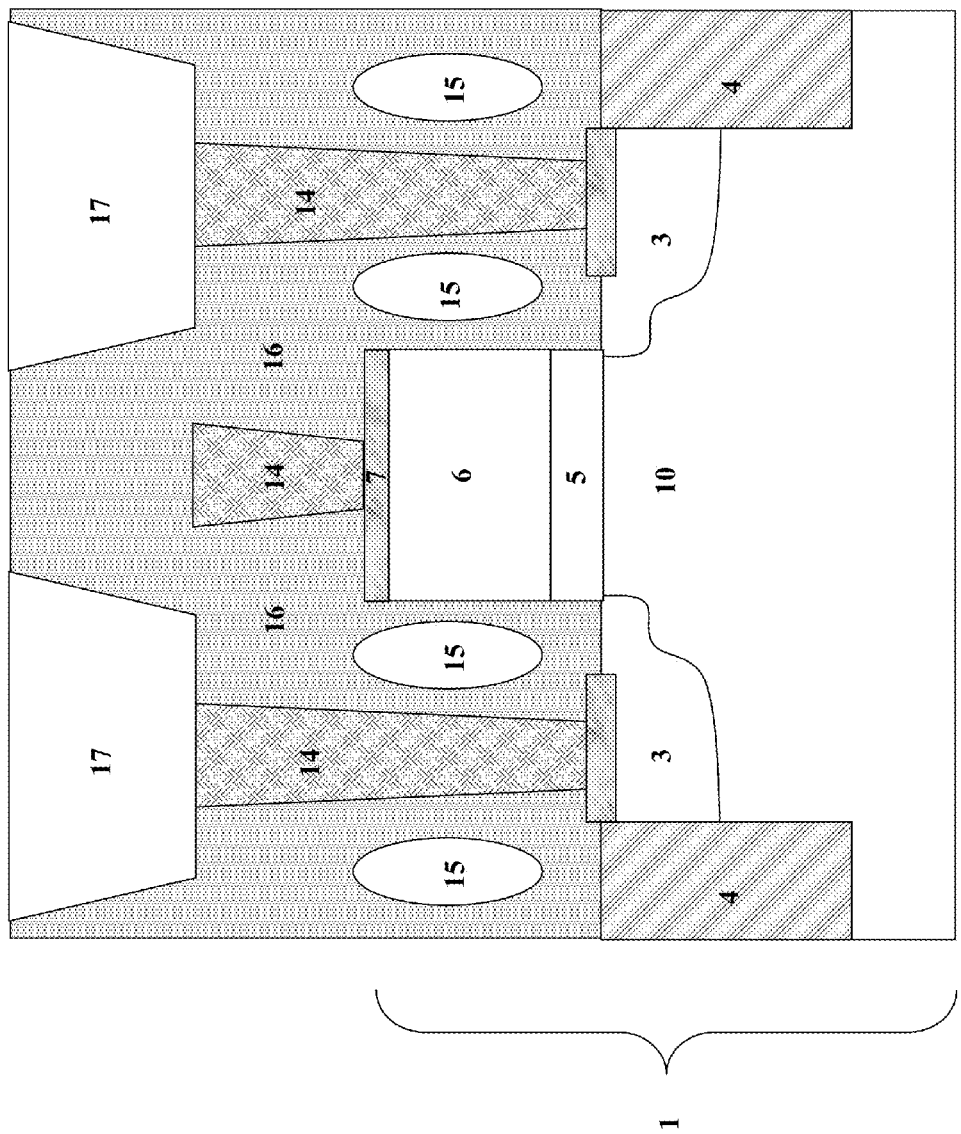
FIG. 9 is a pictorial representation (through a cross-sectional view) of the MOSFET semiconductor structure of FIG. 6 after a low dielectric material has been deposited to form voids between the contacts and gate stack structures, and the low dielectric material has been masked and etched to form a plurality of M1 structures. The low dielectric material is deposited so that a top of the material is taller than a top of the contacts.

FIG. 9 depicts a third aspect of the disclosure, wherein a low dielectric material 16 has been deposited between the contacts 14 and the gate stack structure 12 of the MOSFET semiconductor structure of FIG. 6 to form voids 15, and the low dielectric 16 material has been masked and etched to form a plurality of M1 structures 17. The low dielectric material 16 is deposited so that a top of the material is taller than a top of the contacts 14.

Figure 10:
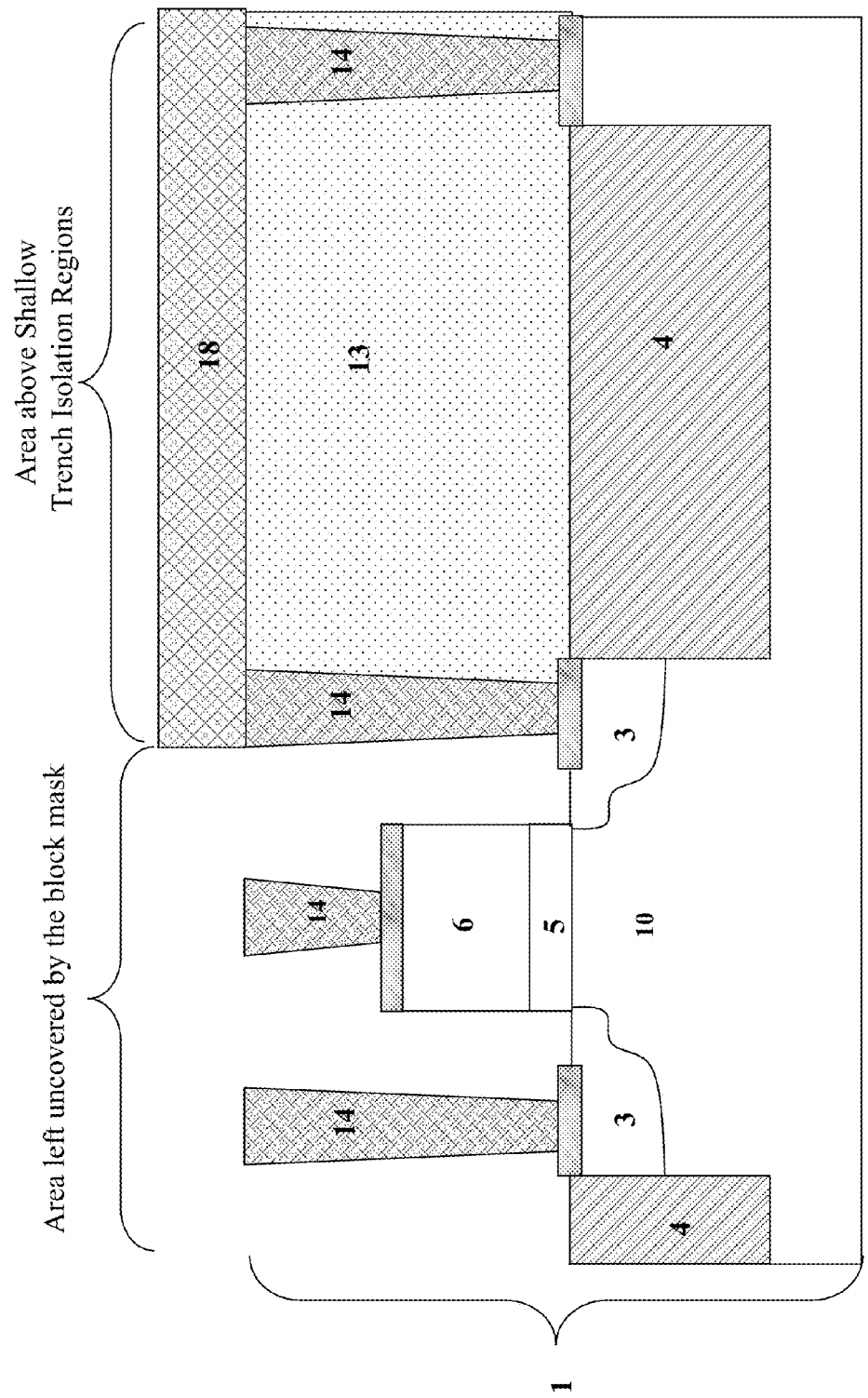
FIG. 10 is a pictorial representation (through a cross-sectional view) of the MOSFET semiconductor structure of FIG. 4 after the block mask has been placed over the sacrificial interlayer dielectric material that is above the shallow trench isolation regions, and the portion of the sacrificial interlayer dielectric material that remains uncovered by the block mask has been removed.

FIG. 10 depicts a fourth aspect of the present disclosure, wherein a block mask 18 has been placed over the sacrificial interlayer dielectric material 13 that is located above the shallow trench isolation regions 4 in the MOSFET semiconductor structure of FIG. 4, and spaces between the contacts 14 and gate stack structure 12 have been formed by removing the sacrificial interlayer dielectric material 13 from the area left uncovered by the block mask 18.

Figure 11:
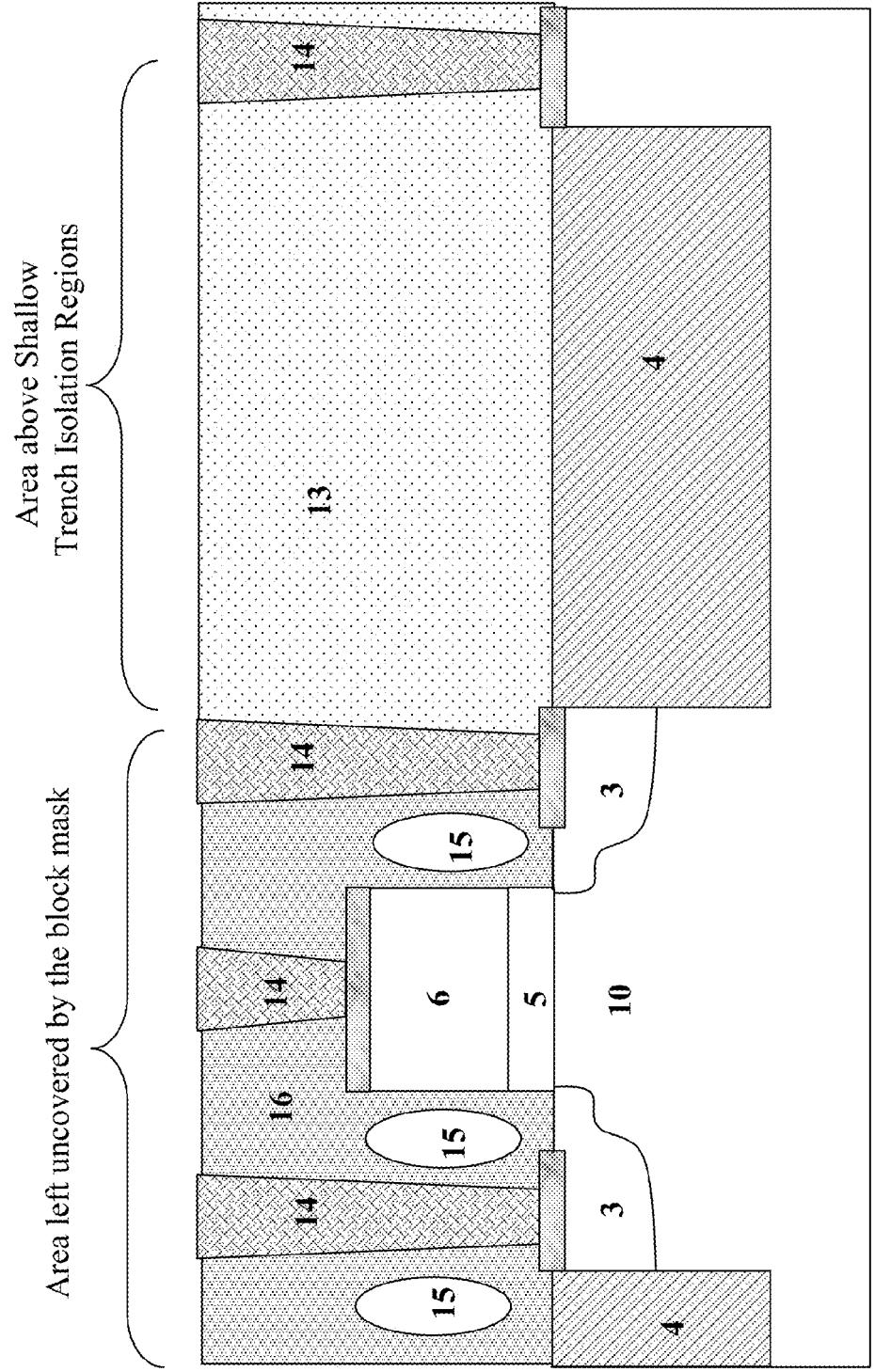
FIG. 11 is a pictorial representation (through a cross-sectional view) of the MOSFET semiconductor structure of FIG. 10 after voids have been formed between the contacts and the gate stack structure, and the block mask has been removed.

FIG. 11 shows the MOSFET semiconductor structure of FIG. 10 after voids 15 have been formed between the contacts 14 and gate stack structure 12, and the block mask 18 has been removed.

Figure 12:
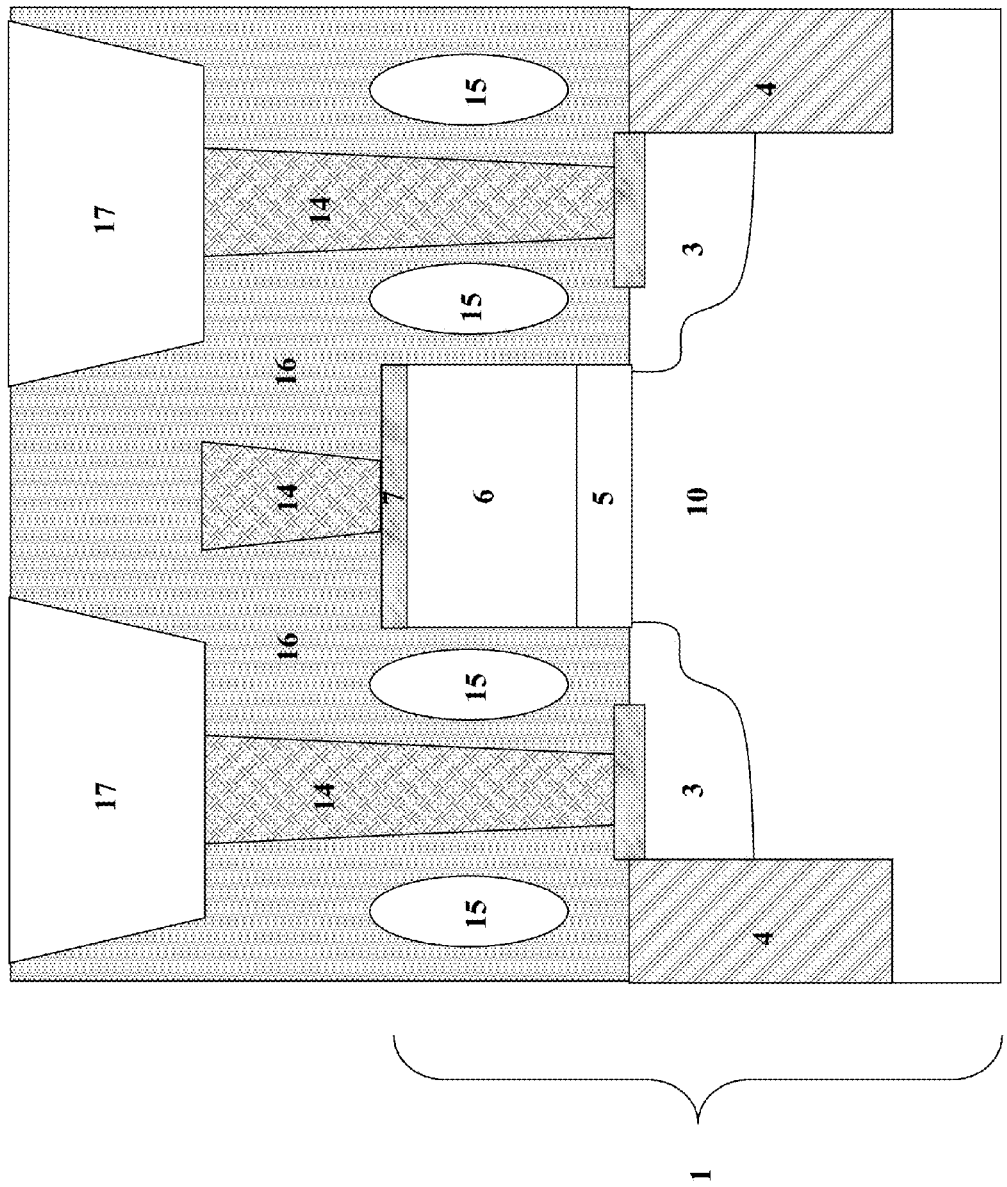
FIG. 12 is a pictorial representation (through a cross-sectional view) of the MOSFET semiconductor structure of FIG. 11 after the plurality of M1 structures have been formed from a second layer of low dielectric material that has been deposited above the contacts to the source/drain structures.

FIG. 12 shows the MOSFET semiconductor structure of FIG. 11 after the plurality of M1 structures 17 have been formed from a second layer of low dielectric material 16 that has been deposited above the contacts 14 to the source/drain structures 3.

Figure 13:
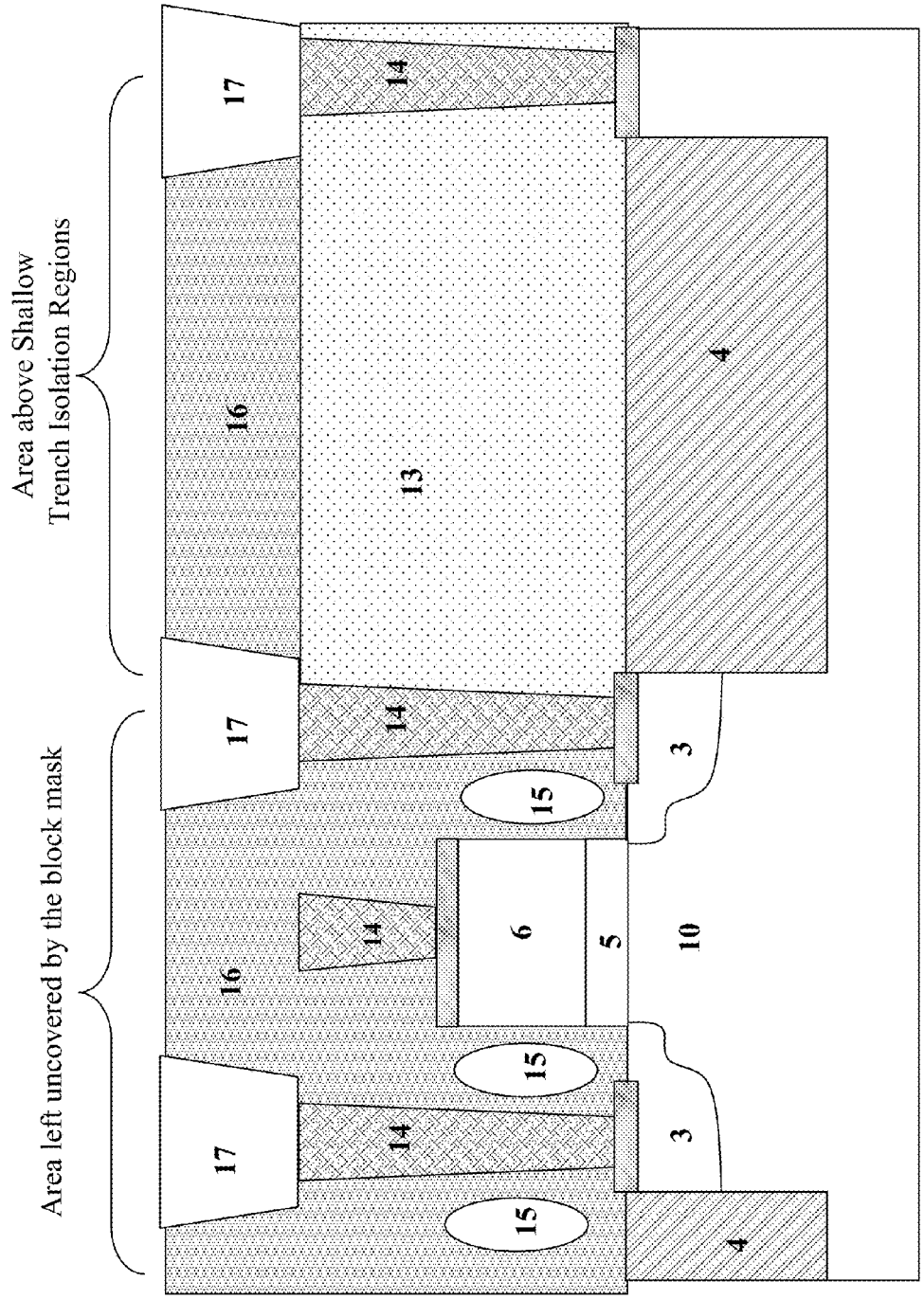
FIG. 13 is a pictorial representation (through a cross-sectional view) of the MOSFET semiconductor structure of FIG. 10 after voids have been formed between the contacts and the gate stack structure, the block mask has been removed, and the low dielectric material has been planarized, masked, and etched to form M1 structures.

FIG. 13 relates to another embodiment of the disclosure, wherein voids 15 have been formed between the contacts 14 and the gate stack structure 12 of the MOSFET semiconductor structure of FIG. 10, and the low dielectric material 16 has been planarized, masked and etched to form a plurality of M1 structures 17.

Still other objects and advantages of the present disclosure will become readily apparent by those skilled in the art from the preceding detailed description, wherein it is shown and described preferred embodiments, simply by way of illustration of the best mode contemplated. As will be realized the disclosure is capable of other and different embodiments, and its several details are capable of modifications in various obvious respects, without departing from the disclosure. Accordingly, the description is to be regarded as illustrative in nature and not as restrictive.

The term "comprising" (and its grammatical variations) as used herein is used in the inclusive sense of "having" or "including" and not in the exclusive sense of "consisting only of." The term "consisting essentially of" as used herein is intended to refer to including that which is explicitly recited along with what does not materially affect the basic and novel characteristics of that recited or specified. The terms "a" and "the" as used herein are understood to encompass the plural as well as the singular.

What is claimed is:

1. A method of making a MOSFET semiconductor structure having reduced parasitic capacitance comprising:
  (a) obtaining a MOSFET device comprising:
    (i) a semiconductor substrate;
    (ii) a gate stack structure comprising: a gate dielectric structure on top of the semiconductor substrate; a conductive gate electrode having a top, a base, and two sidewalls; and a silicide layer on top of the conductive gate electrode;
    (iii) an oxide spacer that is adjacent to each of the two sidewalls of the conductive gate electrode;
    (iv) a nitride spacer that is adjacent to each of the oxide spacers;
    (v) a silicide layer that is on top of the semiconductor substrate and adjacent to each of the nitride spacers;
    (vi) a channel region formed in the semiconductor substrate below the conductive gate electrode and the gate dielectric structure;
    (vii) a plurality of source/drain regions formed in the semiconductor substrate directly below the silicide layer located on top of the semiconductor substrate and adjacent to each of the nitride spacers; and
    (ix) a plurality of shallow trench isolation regions formed in the semiconductor substrate adjacent to each of the source/drain regions;
  (b) depositing a contact etch stop liner over the gate stack structure, nitride spacers and silicide layers that are adjacent to each of the nitride spacers;
  (c) depositing a sacrificial interlayer dielectric material over the contact etch stop liner;
  (d) masking and etching the interlayer dielectric material to pattern a plurality of apertures corresponding to a plurality of contacts to the source/drain and gate stack structures;
  (e) depositing a lining material in the apertures corresponding to the contacts to the source/drain and gate stack structures;
  (f) forming a plurality of contacts to the source/drain and gate stack structures by depositing a conductive material in the lined apertures corresponding to the contacts to the source/drain and gate stack structures;
  (g) forming spaces between the contacts to the source/drain and gate stack structure by removing the sacrificial interlayer dielectric material;
  (h) selectively removing the contact etch stop liner and the oxide spacers;
  (i) selectively removing the nitride spacers;
  (j) forming voids between the contacts and the gate stack structure by depositing a non-conformal oxide, or a low dielectric material, in the spaces between the contacts and the gate stack structure; and
  (k) planarizing the non-conformal oxide, or low dielectric material, using chemical mechanical polishing.

2. The method according to claim 1, wherein the contact etch stop liner comprises nitride.

3. The method according to claim 1, wherein a photoresist material is used to mask the interlayer dielectric material to pattern the plurality of apertures corresponding to the plurality of contacts to the source/drain and gate stack structures.

4. The method according to claim 1, wherein the apertures corresponding to the contacts to the source/drain and gate stack structures are formed using a photolithography and dry-etch process.

5. The method according to claim 1, wherein the lining material comprises Ti/TiN.

6. The method according to claim 1, wherein the conductive material comprises tungsten.

7. The method according to claim 1, wherein the voids between the contacts and the gate stack structure are formed by depositing a low dielectric material.

8. The method according to claim 7, wherein the low dielectric material is a SiCOH film or a fluorinated oxide film, and the low dielectric material is deposited using a chemical vapor deposition technique.

9. The method according to claim 8, wherein the chemical vapor deposition is carried out at a temperature of about 300° Celsius to about 400° Celsius, and a pressure of about 4 Torr to about 10 Torr.

10. The method according to claim 7, wherein the lining material comprises Ti/TiN.

11. The method according to claim 7, wherein the conductive material comprises tungsten.

12. A MOSFET semiconductor structure produced by the process according to claim 1.

13. A method of making a MOSFET having reduced parasitic capacitance comprising:
   (a) obtaining a MOSFET device comprising:
      (i) a semiconductor substrate;
      (ii) a gate stack structure comprising: a gate dielectric structure on top of the semiconductor substrate; a conductive gate electrode having a top, a base, and two sidewalls; and a silicide layer on top of the conductive gate electrode;
      (iii) an oxide spacer that is adjacent to each of the two sidewalls of the conductive gate electrode;
      (iv) a nitride spacer that is adjacent to each of the oxide spacers;
      (v) a silicide layer that is on top of the semiconductor substrate and adjacent to each of the nitride spacers;
      (vi) a channel region formed in the semiconductor substrate below the conductive gate electrode and the gate dielectric structure;
      (vii) a plurality of source/drain regions formed in the semiconductor substrate directly below the silicide layer located on top of the semiconductor substrate and adjacent to each of the nitride spacers; and
      (ix) a plurality of shallow trench isolation regions formed in the semiconductor substrate adjacent to each of the source/drain regions;
   (b) depositing a contact etch stop liner over the gate stack structure, nitride spacer and silicide layers that are adjacent to each of the nitride spacers;
   (c) depositing a sacrificial interlayer dielectric material over the contact etch stop liner;
   (d) masking and etching the interlayer dielectric material to pattern a plurality of apertures corresponding to a plurality of contacts to the source/drain and gate stack structures;
   (e) depositing a lining material in the apertures corresponding to the contacts to the source/drain and gate stack structures;
   (f) forming a plurality of contacts to the source/drain and gate stack structures by depositing a conductive material in the lined apertures;
   (g) forming spaces between the contacts and the gate stack structure by removing the sacrificial interlayer dielectric material;
   (h) selectively removing the contact etch stop liner and the oxide spacers;
   (i) selectively removing the nitride spacers;
   (j) forming voids between the contacts and the gate stack structure by depositing a low dielectric material in the spaces between the contacts and the gate stack structure such that a top of the low dielectric material is taller than a top of the contacts;
   (k) masking and etching the low dielectric material above the contacts to the source/drain structures to define a plurality of M1 structures;
   (l) removing the masking material;
   (m) depositing a liner over the entire MOSFET device;
   (n) plating the M1 structures with Cu; and
   (o) planarizing the Cu using chemical mechanical polishing.

14. The method according to claim 13, wherein the contact etch stop liner comprises nitride.

15. The method according to claim 13, wherein a photoresist material is used to mask the interlayer dielectric material to pattern the plurality of apertures corresponding to the plurality of contacts to the source/drain and gate stack structures.

16. The method according to claim 13, wherein the apertures corresponding to the contacts to the source/drain and gate stack structures are formed using a photolithography and dry-etch process.

17. The method according to claim 13, wherein the lining material comprises Ti/TiN.

18. The method according to claim 13, wherein the conductive material comprises tungsten.

19. A MOSFET semiconductor structure produced by the process according to claim 13.

20. A method of making a MOSFET having reduced parasitic capacitance comprising:
   (a) obtaining a MOSFET device comprising:
      (i) a semiconductor substrate;
      (ii) a gate stack structure comprising: a gate dielectric structure on top of the semiconductor substrate; a conductive gate electrode having a top, a base, and two sidewalls; and a silicide layer on top of the conductive gate electrode;
      (iii) an oxide spacer that is adjacent to each of the two sidewalls of the conductive gate electrode;
      (iv) a nitride spacer that is adjacent to each of the oxide spacers;
      (v) a silicide layer that is on top of the semiconductor substrate and adjacent to each of the nitride spacers;
      (vi) a channel region formed in the semiconductor substrate below the conductive gate electrode and the gate dielectric structure;
      (vii) a plurality of source/drain regions formed in the semiconductor substrate directly below the silicide layer located on top of the semiconductor substrate and adjacent to each of the nitride spacers; and
      (ix) a plurality of shallow trench isolation regions formed in the semiconductor substrate adjacent to each of the source/drain regions;
   (b) depositing a contact etch stop liner over the gate stack structure, nitride spacer, and silicide regions that are adjacent to the nitride spacers;
   (c) depositing a sacrificial interlayer dielectric material over the contact etch stop liner;
   (d) masking and etching the interlayer dielectric material to pattern a plurality of apertures corresponding to a plurality of contacts to the source/drain and gate stack structures;
   (e) depositing a lining material in the apertures corresponding to the contacts to the source/drain and gate stack structures;
   (f) forming a plurality of contacts to the source/drain and gate stack structures by depositing a conductive material in the lined apertures;

(g) placing a block mask over the sacrificial interlayer dielectric material that is above the shallow trench isolation regions;
(h) forming spaces between the contacts and the gate stack structure by removing a portion of the sacrificial interlayer dielectric material that remains uncovered by the block mask;
(i) selectively removing the contact etch stop liner and the oxide spacers;
(j) selectively removing the nitride spacers;
(k) forming voids between the contacts and the gate stack structure by depositing a low dielectric material in the spaces between the contacts and the gate stack structure;
(l) planarizing the lower dielectric material using chemical mechanical polishing;
(m) removing the block mask over the sacrificial interlayer dielectric material that is above the shallow trench isolation regions;
(n) depositing a second layer of low dielectric material above the contacts to the source/drain structures;
(o) masking and etching the low dielectric material above the contacts to the source/drain structures to define a plurality of M1 structures;
(p) removing the masking material;
(q) depositing a liner over the entire MOSFET device;
(r) plating the M1 structures with Cu; and
(s) planarizing the Cu using chemical mechanical polishing.

21. The method according to claim 20, wherein the contact etch stop liner comprises nitride.

22. A MOSFET semiconductor structure produced by the process according to claim 20.

23. A method of making a MOSFET having reduced parasitic capacitance comprising:
(a) obtaining a MOSFET device comprising:
(i) a semiconductor substrate;
(ii) a gate stack structure comprising: a gate dielectric structure on top of the semiconductor substrate; a conductive gate electrode having a top, a base, and two sidewalls; and a silicide layer on top of the conductive gate electrode;
(iii) an oxide spacer that is adjacent to each of the two sidewalls of the conductive gate electrode;
(iv) a nitride spacer that is adjacent to each of the oxide spacers;
(v) a silicide layer that is on top of the semiconductor substrate and adjacent to each of the nitride spacers;
(vi) a channel region formed in the semiconductor substrate below the conductive gate electrode and the gate dielectric structure;
(vii) a plurality of source/drain regions formed in the semiconductor substrate directly below the silicide layer located on top of the semiconductor substrate and adjacent to each of the nitride spacers; and
(ix) a plurality of shallow trench isolation regions formed in the semiconductor substrate adjacent to each of the source/drain regions;
(b) depositing a contact etch stop liner over the gate stack structure, nitride spacer, and silicide regions that are adjacent to the nitride spacers;
(c) depositing a sacrificial interlayer dielectric material over the contact etch stop liner;
(d) masking and etching the interlayer dielectric material to pattern a plurality of apertures corresponding to a plurality of contacts to the source/drain and gate stack structures;
(e) depositing a lining material in the apertures corresponding to the contacts to the source/drain and gate stack structures;
(f) forming a plurality of contacts to the source/drain and gate stack structures by depositing a conductive material in the lined apertures corresponding to the contacts to the source/drain and gate stack structures;
(g) placing a block mask over the sacrificial interlayer dielectric material that is above the shallow trench isolation regions;
(h) forming spaces between the contacts and the gate stack structure by removing a portion of the sacrificial interlayer dielectric material that remains uncovered by the block mask;
(i) selectively removing the contact etch stop liner and the oxide spacers;
(j) selectively removing the nitride spacers;
(k) forming voids between the contacts and the gate stack structure by depositing a low dielectric material in the spaces between the contacts and gate stack structures such that a top of the low dielectric material is taller than a top of the contacts;
(l) planarizing the low dielectric material using chemical mechanical polishing;
(m) removing the block mask over the sacrificial interlayer dielectric material that is above the shallow trench isolation regions;
(n) masking and etching the low dielectric material above the contacts to the source/drain structures to define a plurality of M1 structures;
(o) removing the masking material;
(p) depositing a liner over the low dielectric material;
(q) plating the M1 structures with Cu; and
(r) planarizing the Cu using chemical mechanical polishing.

24. The method according to claim 23, wherein the contact etch stop liner comprises nitride.

* * * * *